US006184588B1

(12) United States Patent
Kim et al.

(10) Patent No.: US 6,184,588 B1
(45) Date of Patent: Feb. 6, 2001

(54) SRAM CELL HAVING BIT LINE SHORTER THAN WORD LINE

(75) Inventors: Han-soo Kim; Kyeong-tae Kim, both of Suwon (KR)

(73) Assignee: Samsung Electronics Co., Ltd., Suwon (KR)

(*) Notice: Under 35 U.S.C. 154(b), the term of this patent shall be extended for 0 days.

(21) Appl. No.: 09/298,840

(22) Filed: Apr. 26, 1999

(30) Foreign Application Priority Data

Jun. 12, 1998 (KR) .................................................. 98-21966

(51) Int. Cl.[7] ...................................................... H01L 27/11
(52) U.S. Cl. ............................................. 257/903; 257/904
(58) Field of Search .................................. 257/903, 904, 257/379, 66, 206, 211

(56) References Cited

U.S. PATENT DOCUMENTS 5,379,251 * 1/1995 Takeda et al. ........................ 257/903

FOREIGN PATENT DOCUMENTS 0 506 089 A2   9/1992 (EP) .

* cited by examiner

*Primary Examiner*—Minh Loan Tran
*Assistant Examiner*—Thien F. Tran
(74) *Attorney, Agent, or Firm*—Jones Volentine, LLC

(57) ABSTRACT

An SRAM cell having a word line shorter than a bit line is provided. First and second driver transistors having first and second gate electrodes parallel to each other are formed on a semiconductor substrate, and a third gate electrode shared by first and second transfer transistors is formed between the first and the second gate electrodes. A word line electrically connected to the third electrode is perpendicular to the first and the second gate electrodes, and a pair of bit lines electrically connected to drain areas of the first and the second transfer transistors are perpendicular to the word line. Also, a pair of ground lines are electrically connected to the source areas of the first and the second driver transistors, and are parallel to the bit lines.

26 Claims, 20 Drawing Sheets

SRAM CELL HAVING BIT LINE SHORTER THAN WORD LINE

BACKGROUND OF THE INVENTION

1. Field of the Invention

The present invention relates to a memory cell of a semiconductor device, and more particularly, to a Static Random Access Memory (SRAM) cell having a bit line shorter than a word line.

2. Description of the Related Art

An SRAM device requires no refresh operation and has a higher operation speed than a Dynamic Random Access Memory (DRAM) device, and low power consumption. Thus, the SRAM device is widely used for a cache memory of a computer or portable electronic device. A unit cell of the SRAM device is composed of a pair of driver transistors, a pair of transfer transistors and a pair of load devices. An SRAM cell may be either a high load resistor cell or a CMOS type cell, depending on a load device type. The high load resistor cell uses a high load resistor of approximately $1 \times 10^9$ $\Omega$ or more as the load device, and is stacked on the driver transistor and the transfer transistor which are NMOS transistors. In the CMOS type cell, both the driver transistor and the transfer transistor are NMOS transistors, and the load device is a PMOS transistor. The PMOS transistor used for the load device is a thin film transistor (TFT) or a bulk transistor. If the PMOS transistor used for the load device is a bulk transistor, the cell area is increased. However, if a TFT is used for the load device, the TFT can be stacked on the driver transistor and the transfer transistor. Thus, in the SRAM cell in which the TFT is used as the load device, the cell area can be minimized similar to a high load resistor cell.

As described above, since the SRAM cell using the TFT or resistor as the load device can minimize the cell area, it is widely used for a highly-integrated SRAM device.

FIG. 1 is a layout diagram of an SRAM cell disclosed in U.S. Pat. No. 5,379,251.

Referring to FIG. 1, an isolation area 24 defining a pair of active areas which are parallel with each other along the y-direction, is arranged on a semiconductor substrate. In each of the active areas, a transfer transistor and a driver transistor are arranged in series. Also, a pair of transfer transistors formed on active areas adjacent to each other shares a gate electrode passing the center of the cell and intersecting the active area, i.e., a word line 21. The word line 21 and the gate electrodes 22 and 23 of the driver transistor are not concurrently formed in the process. A node contact 25 is arranged between the driver transistor and the transfer transistor connected in series with the driver transistor, and a gate electrode contact 27 is arranged on the gate electrodes 22 and 23, of each of the driver transistors. Thus, two node contacts 25 and two gate electrode contacts 27 are formed in a cell. The active area exposed by the node contact 25 is connected to the gate electrode of the driver transistor which is adjacent to the exposed active area along the y-direction through the gate electrode contact 27, to form a latch circuit. Also, a ground contact 28 is arranged on a source area of each of the driver transistors, and a bit line contact 26 is arranged on a drain area (or a source area) of each of the transfer transistors. Although it is not shown in FIG. 1, in the U.S. Pat. No. 5,379,251, it is disclosed that a ground plate exposing the upper portion of the bit line contact 26 and covering the ground contact 28 is arranged on the entire surface of the cell area.

In the SRAM cell disclosed U.S. Pat. No. 5,379,251, the length of the cell in the y-direction is longer than in the x-direction. Thus, the bit line is longer than the word line in one cell. As the bit line is longer, parasitic capacitance of the bit line is more, thereby increasing the delay time of a signal transferred through the bit line. As a result, it is difficult to improve the operation speed of the SRAM device. Also, according to the SRAM cell disclosed U.S. Pat. No. 5,379, 251, there is a portion in which the word line overlaps the gate electrode of the driver transistor. That is, the word line, acting as the gate electrode of the transfer transistor, and the gate electrode of the driver transistor are not formed in the same process. Thus, the manufacturing process of the SRAM cell is complicated, and the parasitic capacitance of the word line is increased, so that it is difficult to rapidly select a desired cell. Meanwhile, as disclosed in the U.S. Pat. No. 5,379,251, the ground plate covering all of the ground contact is arranged on the entire surface of the cell array area, to thereby minimize voltage drop caused by the ground plate, which can improve an operating voltage margin of each cell. However, this also increases the parasitic capacitance between the bit line and the ground plate and the parasitic capacitance between the word line and the ground plate, which makes the operation speed of the SRAM device slow.

FIG. 2 is an equivalent circuit diagram of a part of the cell array area in which other conventional SRAM cells, unlike that of FIG. 1, are arranged in a matrix.

Referring to FIG. 2, a plurality of SRAM cells C11, C12, ..., C1n, ... are connected to the first word line WL1, running in the x-direction, and share a first ground line $V_{ss1}$. A plurality of SRAM cells C21, C22, ..., C2n, ... are connected to a second word line WL2, running parallel to the first word line WL1, and share a second ground line $V_{ss2}$. That is, the ground lines and the word lines run in the x-direction. Also, a power supply line $V_{cc}$ which supplies power to each cell is arranged parallel to the word lines.

Meanwhile, the cells C11, C21, ..., running in the y-direction of FIG. 2, share a pair of bit lines BL1 and /BL1. Also, the cells C12, C22, ... share another pair of bit lines BL2 and /BL2. Thus, the word lines intersect the bit lines.

As shown in FIG. 2, the SRAM device in which a plurality of cells connected to a word line share one ground line has a reduced operation voltage range of its SRAM cells. For example, if a power voltage $V_{cc}$ is applied to the first word line WL1 in order to select one cell from the cells C11, C12, ..., C1n, ... connected to the first word line WL1, transfer transistors of all cells connected to the first word line WL1 are turned on. Accordingly, cell currents $I_1$, $I_2$, ..., $I_n$, ... flow through all cells C11, C12, ..., C1n, ... from bit lines BL1, /BL1, BL2, /BL2, ..., BLn, /BLn, ... precharged to a predetermined voltage, e.g., a power supply voltage. At this time, the voltage drop caused by the cell currents $I_1, I_2, ..., I_n, ...$ occurs in the first ground line $V_{ss1}$. The voltage drop is caused by resistance Rs of the ground line and contact resistance Rc between a source area of the driver transistor and the ground line. As a result, the current which flows through all cells C11, C12, ..., C1n, ... connected to the first word line WL1 flows through a ground line, i.e., the first ground line, so that a positive (+) voltage higher than the ground voltage is induced to the source area of the driver transistor of each cell. Accordingly, the highest positive voltage is induced to the source area of the driver transistors of cells C1n and C2n further from an end the word line. For example, if the power supply voltage $V_{cc}$ is applied to the first word line WL1, cell currents $I_1, I_2, ..., I_n, ...$ flow through the first ground line Vss1 from all cells $C_{11}, C_{12} ..., C_{1n}, ...$ connected to the first word line WL1.

At this time, the voltage $V_{SN}$ induced to the source area of driver transistors of the nth cell C1n is as follows:

$$VSN = Rs \times \sum_{i=0}^{n} (i \times li) + \ln \times Rc \qquad (1)$$

It is understood in Formula 1 that as more cells share a ground line, the voltage induced to the source area of the driver transistor of the cell farthest from the end of the ground line is higher. Thus, the operation voltage range of the SRAM cell is reduced, to thereby deteriorate the low voltage characteristics of the SRAM device.

SUMMARY OF THE INVENTION

It is an objective of the present invention to provide an SRAM cell in which parasitic capacitance of a bit line and parasitic capacitance of a word line are reduced, to improve the operational speed of a cell, and a voltage drop in a ground line is minimized, to improve low voltage operation characteristics.

Accordingly, to achieve the above objective an SRAM device according to one or more aspects of the present invention includes first and second driver transistors, having first and second gate electrodes parallel to each other, on the semiconductor substrate, and first and second transfer transistors sharing a third gate electrode arranged between the first gate electrode and the second gate electrode. The third gate electrode functions as a common gate electrode of the first and the second transfer transistors. The first transfer transistor is serially connected to the first driver transistor, and the second transfer transistor is serially connected to the second driver transistor. Preferably, a line along a direction corresponding to the channel length of the first and the second transfer transistors forms an angle of between 20–70° with respect to a line along a direction corresponding to the channel length of the first and the second driver transistors. Also, the first and the second driver transistors are serially connected to the first and the second transfer transistors arranged between the first gate electrode and the second gate electrode, so that source areas of the first and the second driver transistors are formed on an edge of the cell. The pair of the driver transistors and the pair of the transfer transistors are NMOS transistors. If an SRAM cell having a pair of transfer transistors between the pair of the driver transistors is formed on a rectangular plane, the cell length corresponding to the channel width of the driver transistor is shorter than that corresponding to the channel length direction of the driver transistor.

Also, a word line is electrically connected to the third gate electrode, and arranged vertical to the first and the second gate electrodes. Preferably, the word line passes across the center of the cell. Thus, the word line passes between the first and the second transfer transistors. As a result, the first and the second transfer transistors are arranged on the both sides of the word line, respectively.

Furthermore, a pair of ground lines are electrically connected to the source areas of the first and the second driver transistors. Preferably, the pair of ground lines are above to the word line.

Also, a pair of bit lines are included between the pair of ground lines. The pair of bit lines are parallel with the ground lines. One of the bit lines is electrically connected to a drain area of the first transfer transistor confronting the first node junction which is shared by the first transfer transistor and the first driver transistor, and the other is electrically connected to a drain area of the second transfer transistor confronting the second node junction which is shared by the second transfer transistor and the second driver transistor.

Moreover, a pair of power lines are interposed between the semiconductor substrate and each of the ground lines. One of the power lines is electrically connected to the first gate electrode and the drain area of the second driver transistor through a load device, and the other is electrically connected to the second gate electrode and the drain area of the first driver transistor through another load device. Preferably, resistors or thin film transistors are widely used as the load devices, and the thin film transistor is a PMOS transistor.

Thus, a bit line length of the SRAM cell formed on the rectangular plane is shorter than the word line length thereof. Thus, in a cell array area in which a plurality of unit cells are matrix-arranged, parasitic capacitance of each of the bit lines can be reduced, so that the operational speed of the cell, e.g., the access time for reading out information stored in the cell can be improved. Also, the ground line above to the word line, so that voltage drop caused by the ground line connected to the selected cell can be reduced. Thus, the operational voltage range of the cell can be maximized, to thereby improve the low voltage characteristic of the cell.

BRIEF DESCRIPTION OF THE DRAWINGS

The above objects and advantages will become more apparent by describing in detail a preferred embodiment thereof with reference to the attached drawings in which:

FIGS. 13A through 18A are sectional views of the SRAM cell of FIG. 12, taken along line AA' showing a stage in a process sequence;

FIGS. 13B through 18B are sectional views of the SRAM cell of FIG. 12, taken along line BB' showing a stage in a process sequence;

FIGS. 13C through 18C are sectional views of the SRAM cell of FIG. 12, taken along line CC' showing a stage in a process sequence.

DESCRIPTION OF THE PREFERRED EMBODIMENTS

Figure 1:
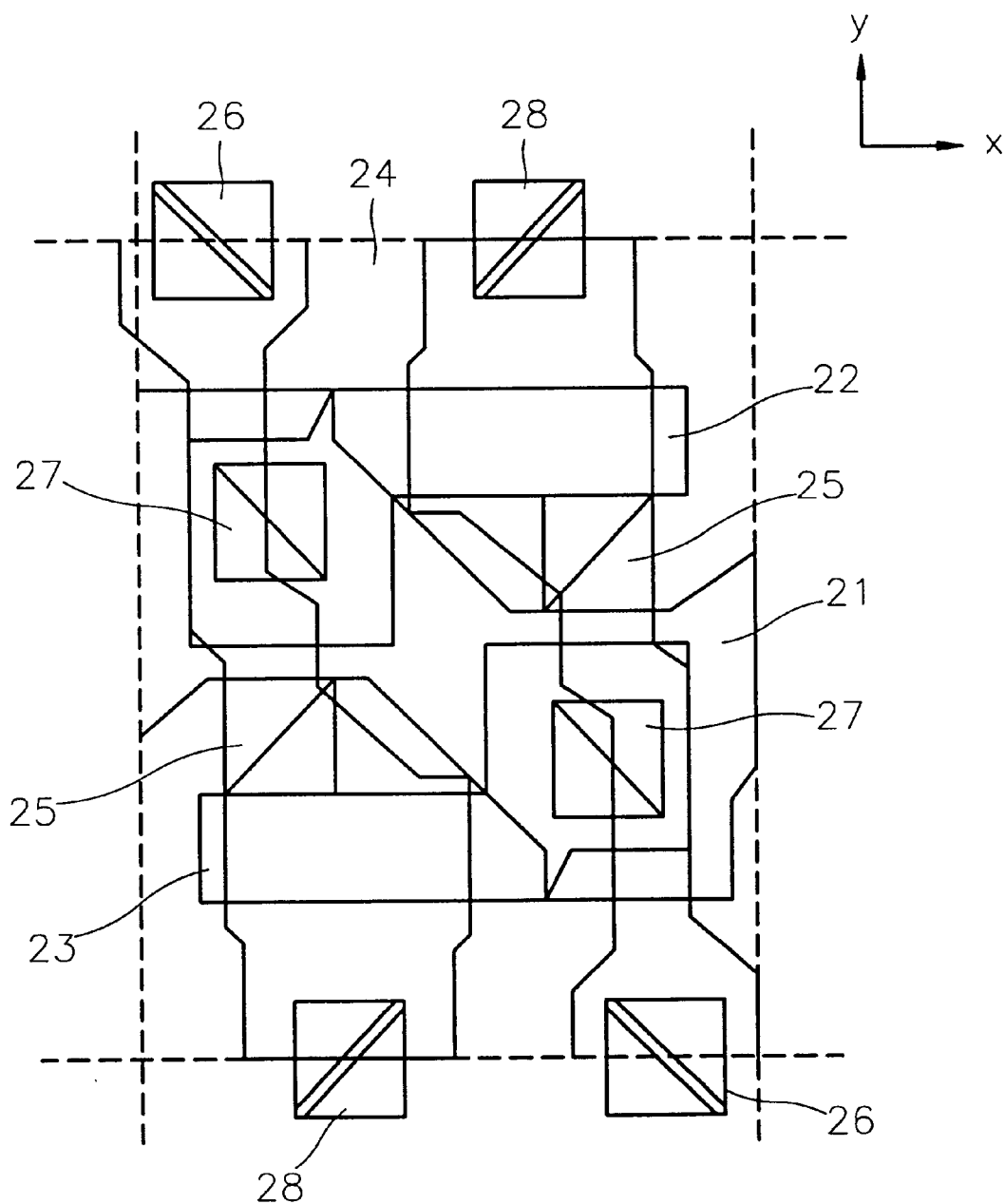
FIG. 1 is a layout diagram showing a conventional SRAM cell.
Figure 2:
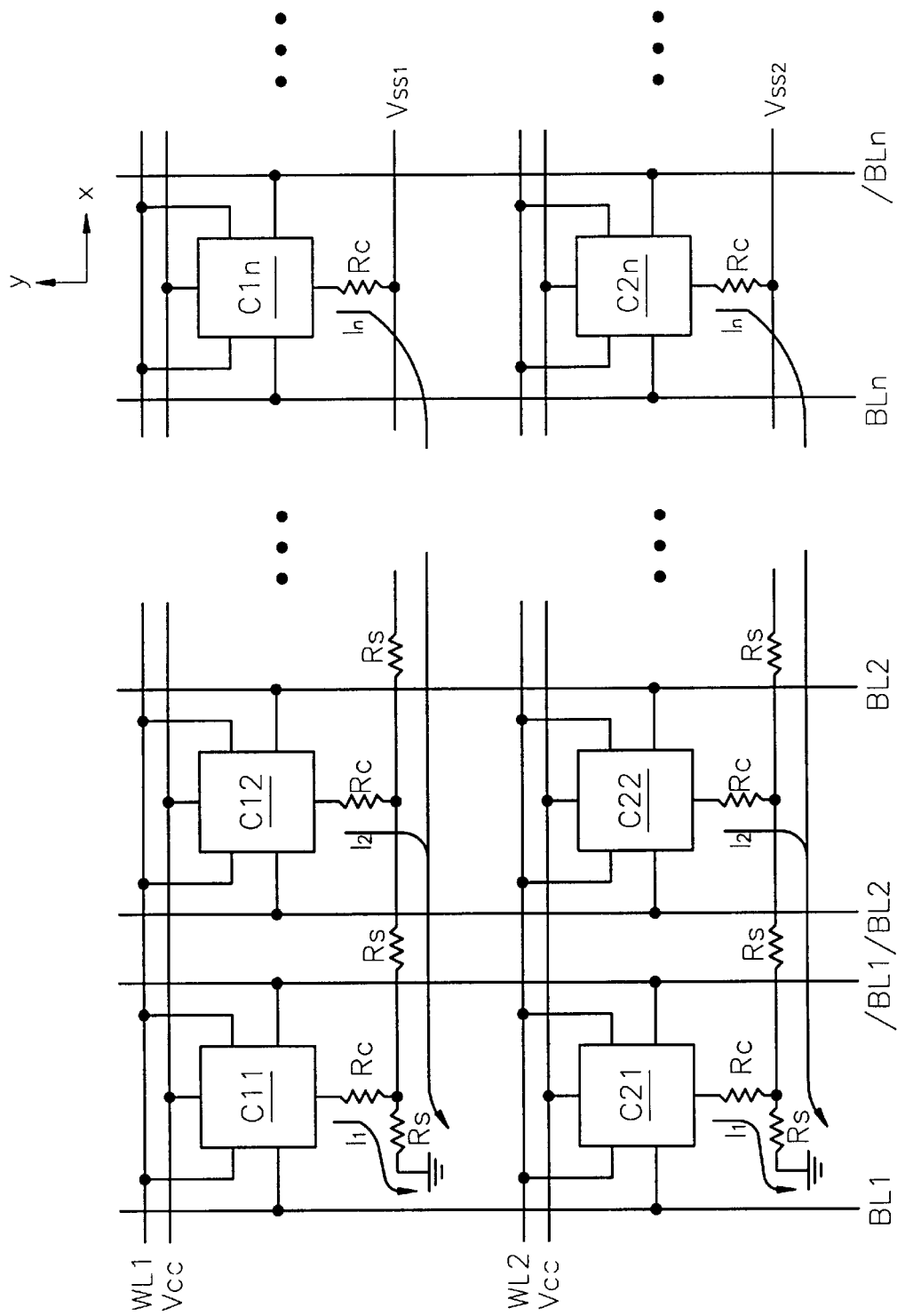
FIG. 2 is an equivalent circuit diagram of part of a cell array area in which other conventional SRAM cells, unlike that of FIG. 1, are arranged in a matrix.

In the embodiments described hereafter, a high load resistor cell using a resistor as a load device is described, but the same concepts may be also applied in a TFT cell using a PMOS thin film transistor as a load device.

Referring to FIGS. 3, 4, 13A, 13B and 13C, an SRAM cell includes first and second gate electrodes 103a and 103b arranged parallel with the y-axis, on a semiconductor substrate 100. The first gate electrode 103a together with an active area 101 intersecting the first gate electrode 103a in the x-direction constitutes a first driver transistor TD1, and the second gate electrode 103b together with the active area 101 intersecting the gate electrode 103b in the x-direction constitutes a second driver transistor TD2. Reference numeral 101a of FIGS. 13A, 13B and 13C denotes an isolation film defining the active area 101. A third gate electrode 103c is arranged between the first gate electrode 103a and the second gate electrode 103b. The third gate electrode 103c is used as a common gate electrode of first and second transfer transistors TA1 and TA2. The first transfer transistor TA1 is connected in series with the first driver transistor TD1, and the second transfer transistor TA2 is connected in series with the second driver transistor TD2. Here, the channel length direction of the first and second transfer transistors TA1 and TA2 with respect to that of the first and second driver transistors TD1 and TD2 is 20°–70°, preferably 45°.

As described above, if the first and second transfer transistors TA1 and TA2 sharing the third gate electrode 103c are arranged between the first and the second driver transistors TD1 and TD2, the length of the SRAM cell in the y-direction, parallel with the first and the second gate electrodes 103a and 103b, can be shorter than the length in the x-direction.

Figure 5:
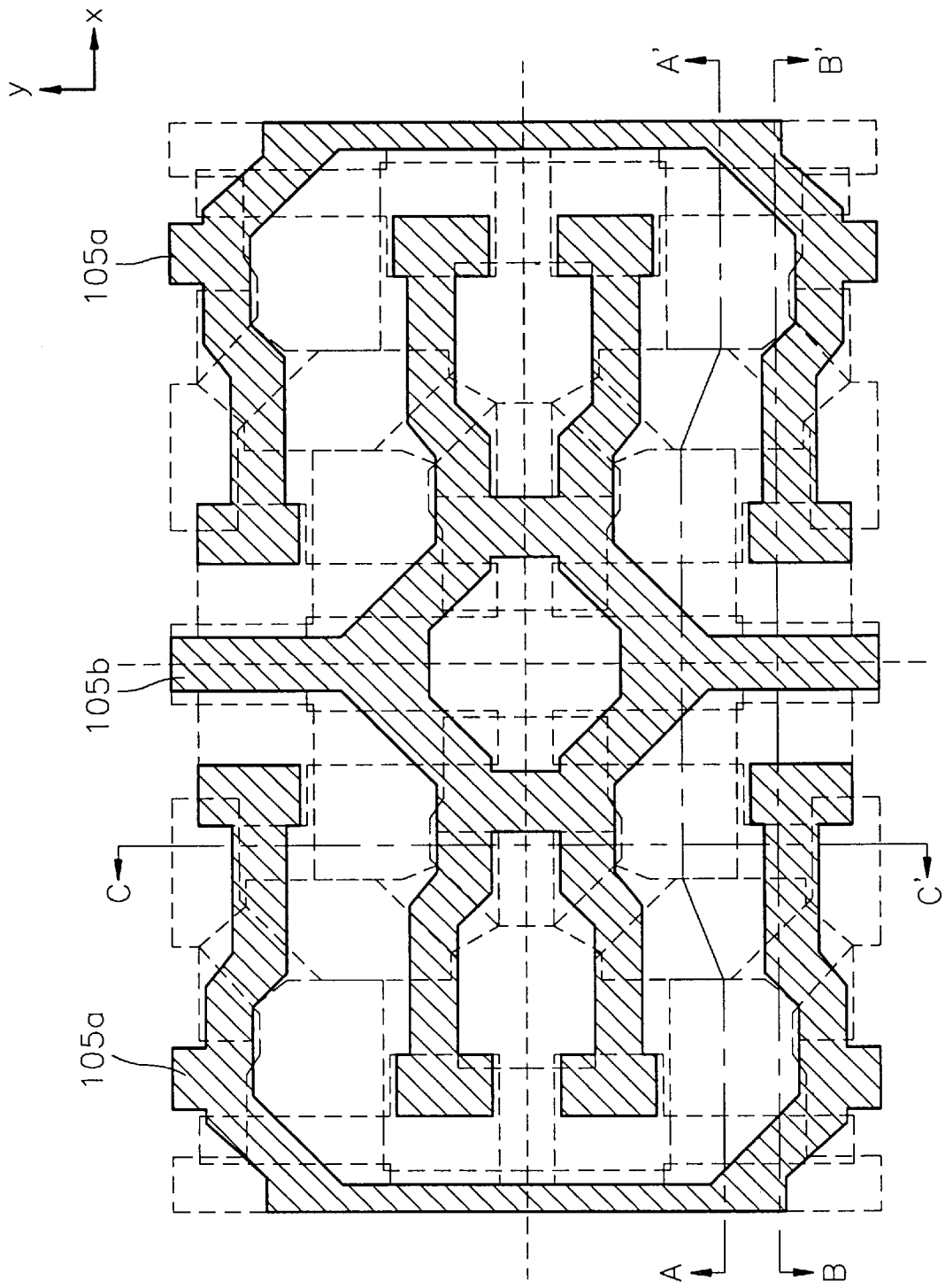
Figure 6:
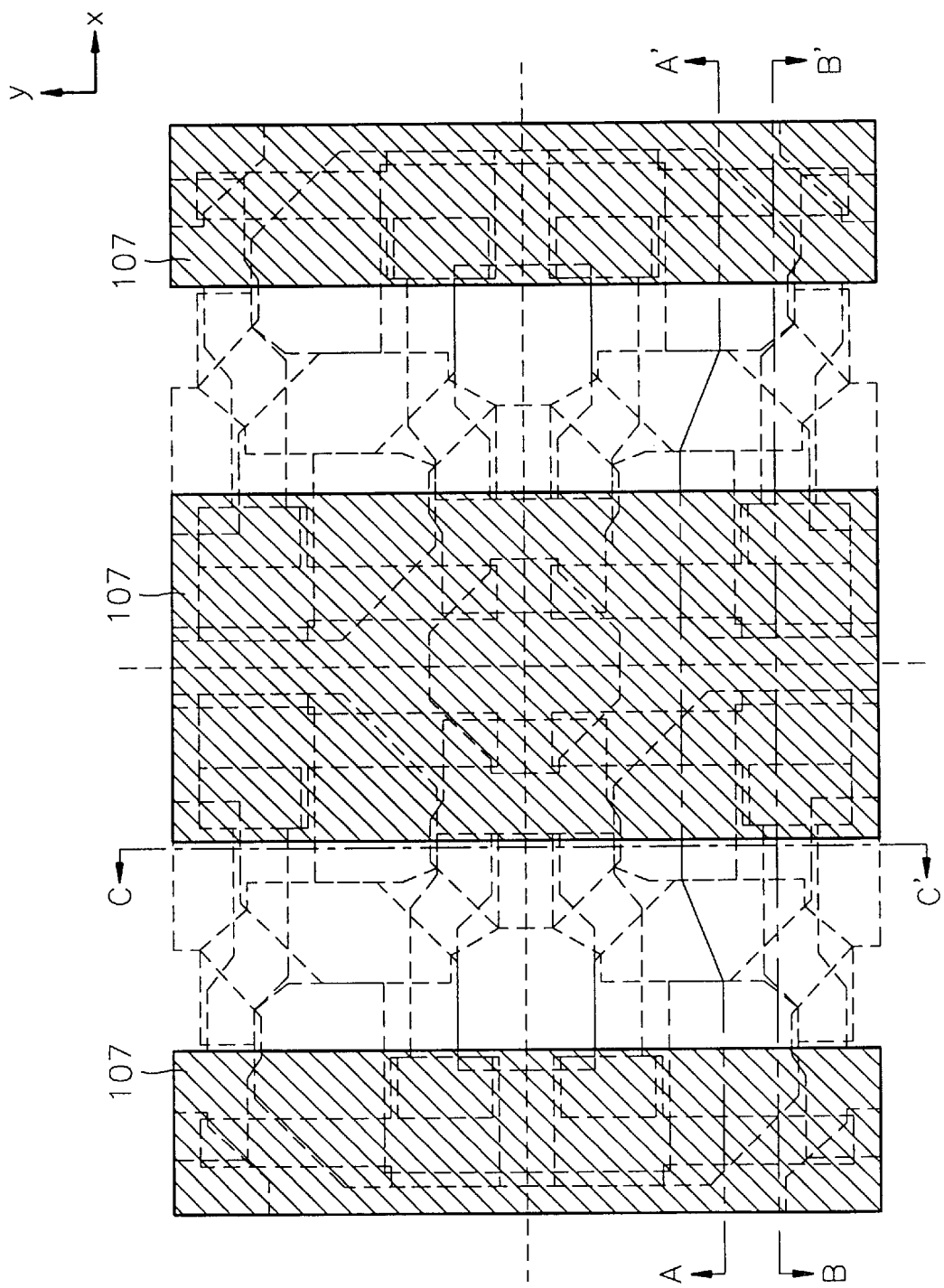

Referring to FIGS. 5 and 6, according to the SRAM cell of the present invention, a pair of conductive layer patterns 105a and 105b are arranged parallel with the y-axis above source areas of the first and the second driver transistors TD1 and TD2. The first conductive layer pattern 105a extends to the gate electrode of the second driver transistor, i.e., the upper portion of the second gate electrode 103b. The second conductive layer pattern 105b extends to the gate electrode of the first driver transistor, i.e., the upper portion of the first gate electrode 103a. In the first and the second conductive layer patterns 105a and 105b, portions above the source areas of the first and the second driver transistors and above the first and the second gate electrodes 103a and 103b are selectively doped with an impurity, using the mask patterns 107 of FIG. 6. The doped conductive layer patterns 105a and 105b act as a power line ($V_{cc}$ line) supplying power to the SRAM cell. Also, the parts of the conductive layer patterns 105a and 105b, which are undoped act as a pair of load resistors used as the load device of the SRAM cell. The pair of load resistors are arranged to pass the upper portions of the channel areas of the first and the second transfer transistors respectively. A pair of PMOS thin film transistors can be used instead of the pair of load resistors.

Figure 7:
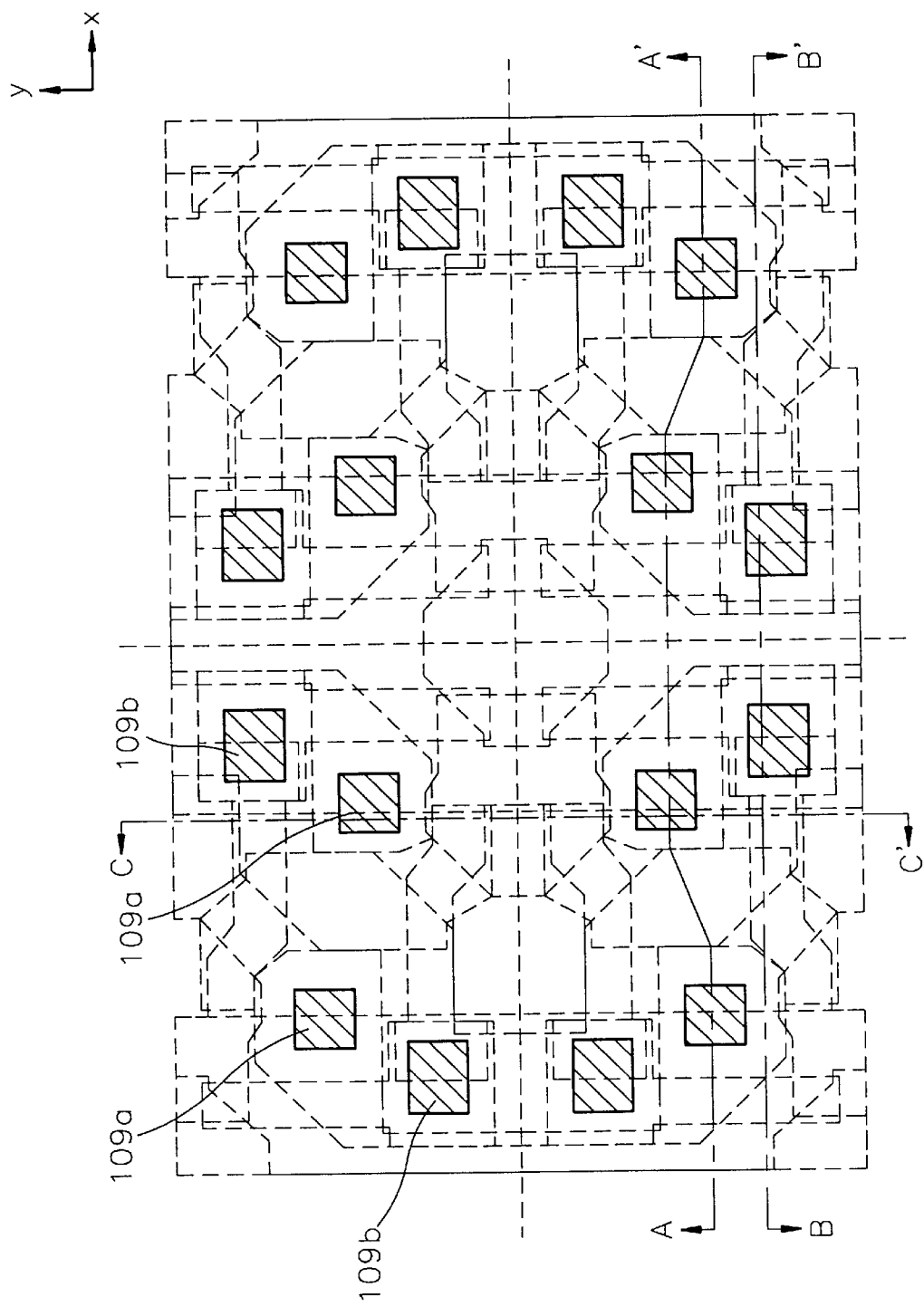
Figure 8:
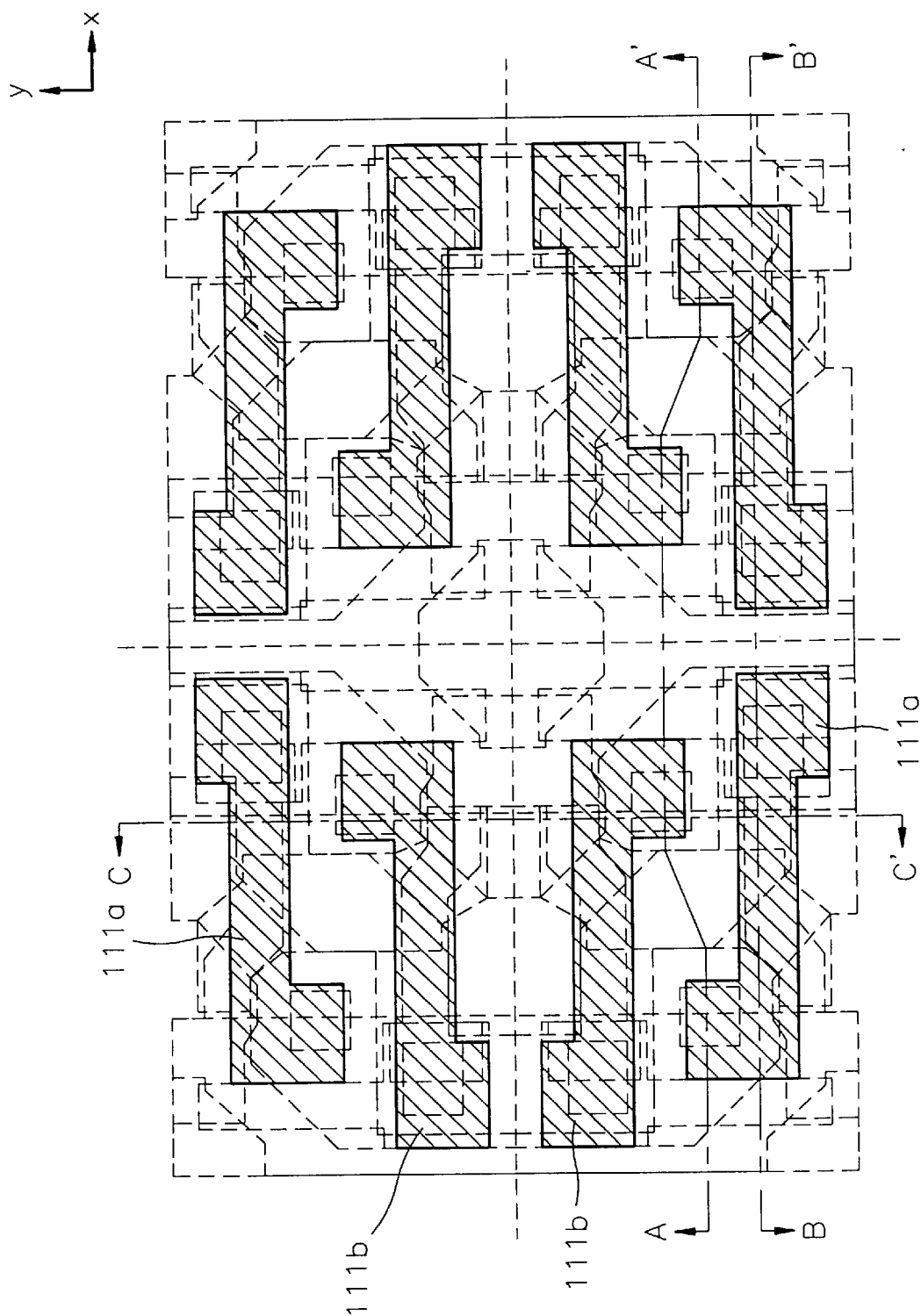
Figure 9:
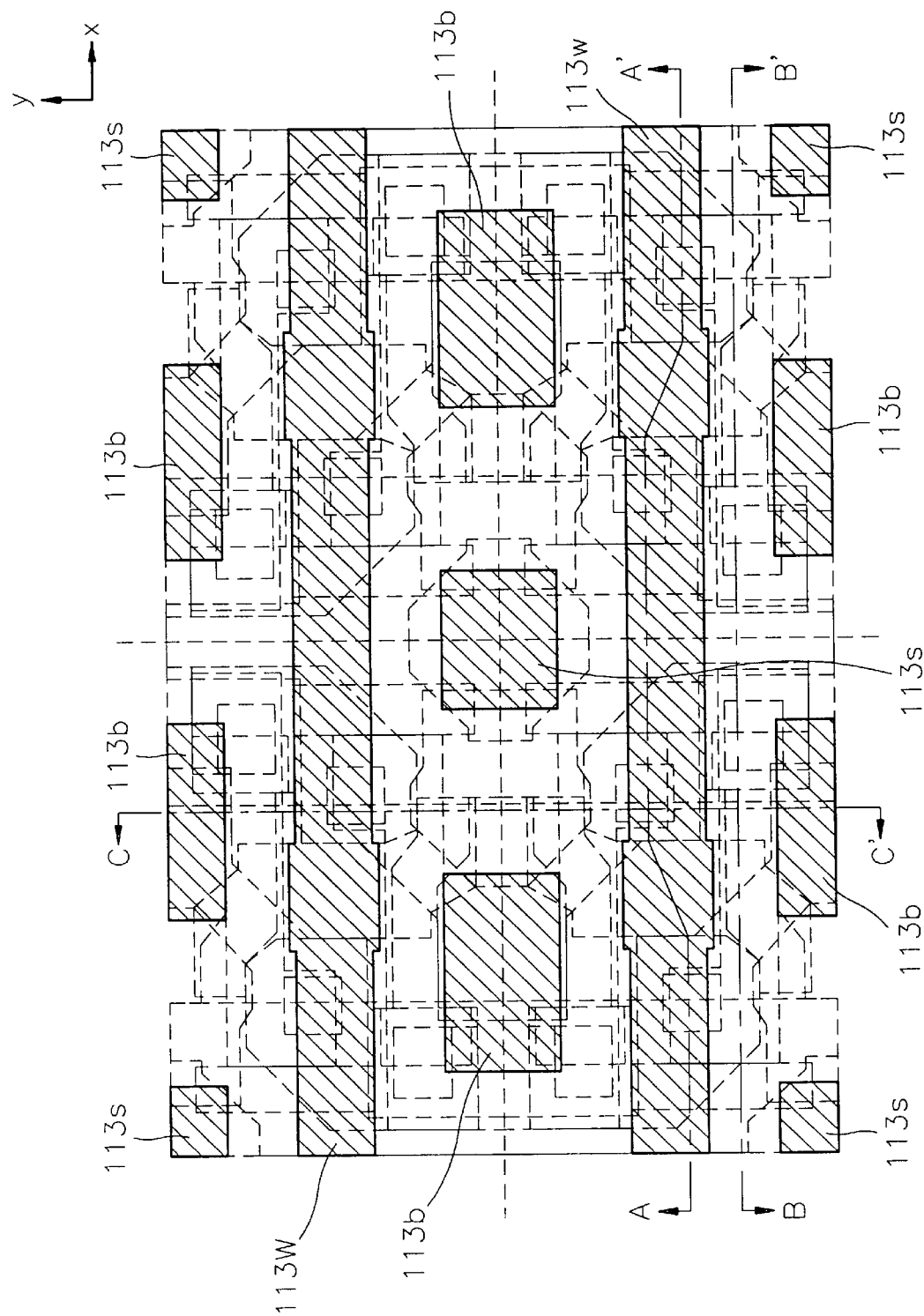
Figure 10:
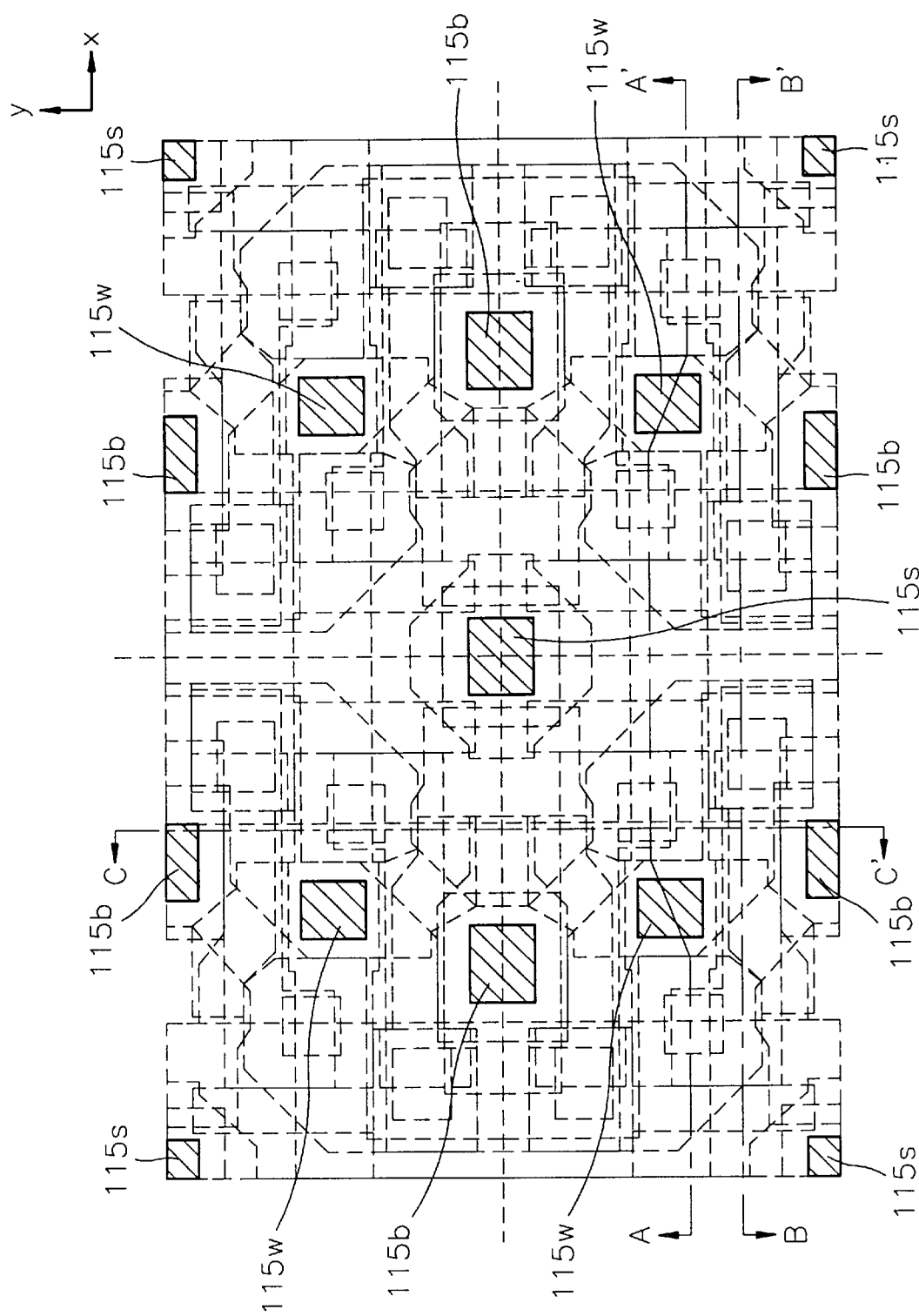
Figure 11:
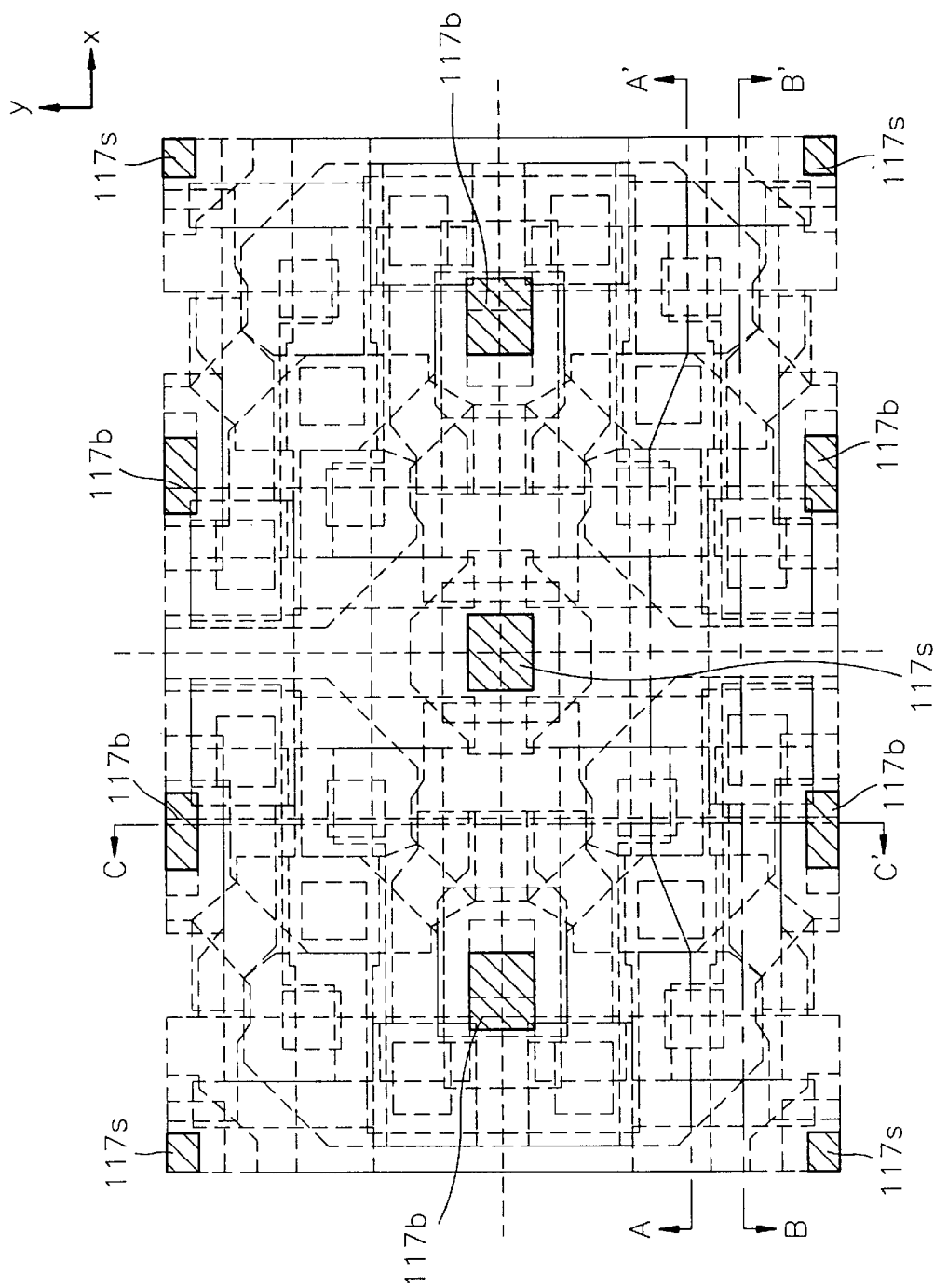
Figure 12:
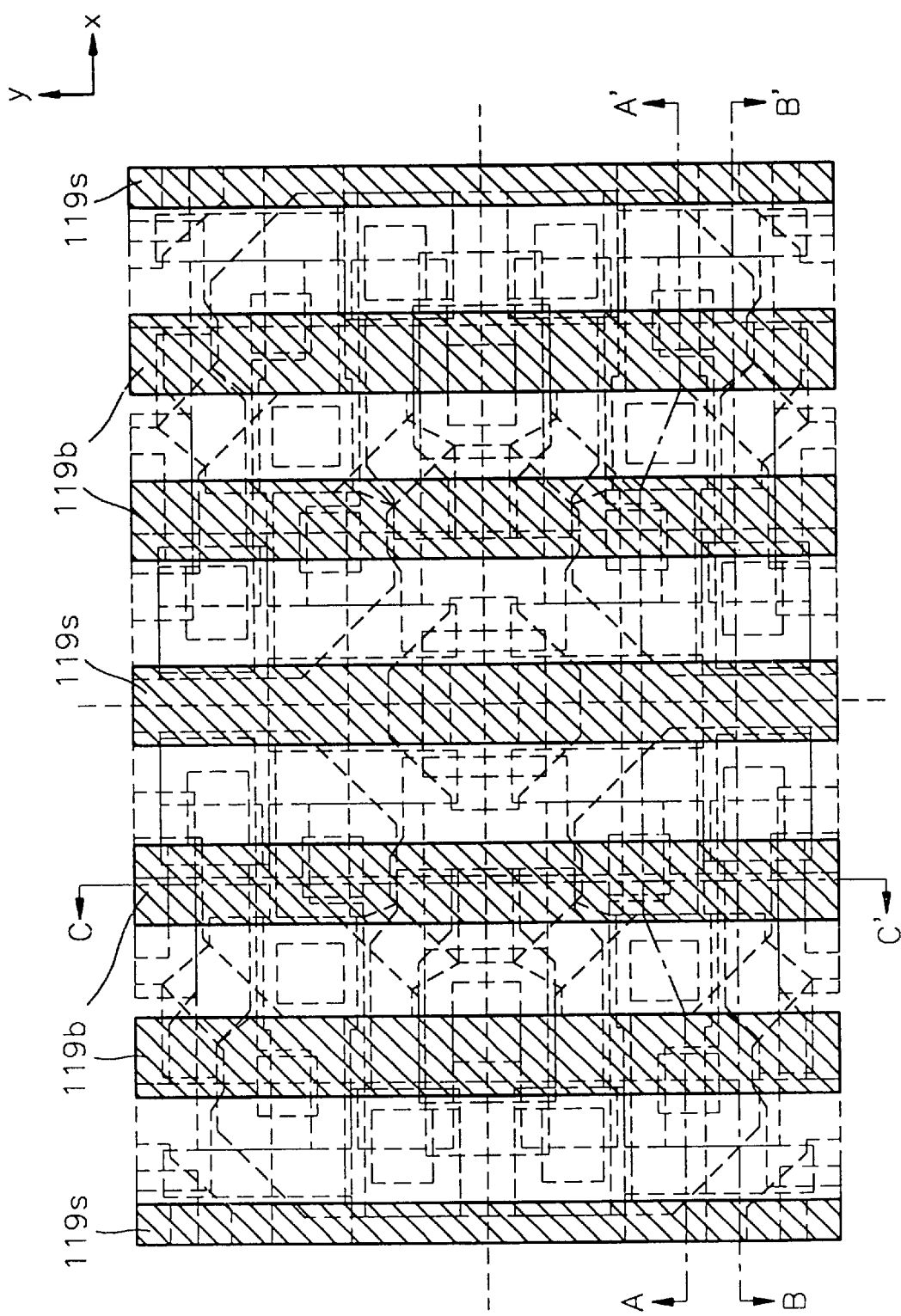

Referring to FIGS. 7 and 8, the drain area of the first driver transistor TD1, the second gate electrode 103b and one load resistor connected to power line 105a are electrically connected to each other by a first local interconnection line 111a. Also, the drain area of the second driver transistor TD2, the first gate electrode 103a and other load resistor connected to another power line 105b are connected to each other by a second local interconnection line 111b. Thus, a pair of driver transistors TD1 and TD2 and a pair of load resistors together with first and second local interconnections 111a and 111b constitute a latch circuit. Here, one end of the first local interconnection line 111a is connected to the drain area of the first driver transistor TD1 through one node contact 109a, and the other end of the first local interconnection line 111a is connected to the second gate electrode 103b and the one load resistor through one butted contact 109b. Also, one end of the second local interconnection line 111b is connected to the drain area of the second driver transistor TD2 through the other node contact 109a, and the other end of the second local interconnection line 111b is connected to the first gate electrode 103a and the other load resistor through the other butted contact 109b.

Referring to FIGS. 9, 10, 11 and 12, the third gate electrode 103c is electrically connected to a word line 113w running parallel with the x-direction through word line contact hole 115w, and the source areas of the first and the second driver transistors TD1 and TD2 are electrically connected respectively to a pair of ground lines 119s running parallel with the y-direction through a pair of ground line pad contact holes 115s, a pair of ground line pads 113s and a pair of ground line contact holes 117s. The pair of ground lines 119s are arranged parallel with the y-axis. Drain areas of the first and the second transfer transistors TA1 and TA2 are electrically connected respectively to a pair of bit lines 119b through a pair of bit line contact holes 115b, a pair of bit line pads 113b and a pair of bit line contact holes 117b. The pair of bit lines 119b, also run parallel with the y-axis and are arranged between the pair of ground lines 119s.

A method for manufacturing an SRAM cell according to the present invention will now be described.

Figure 3:
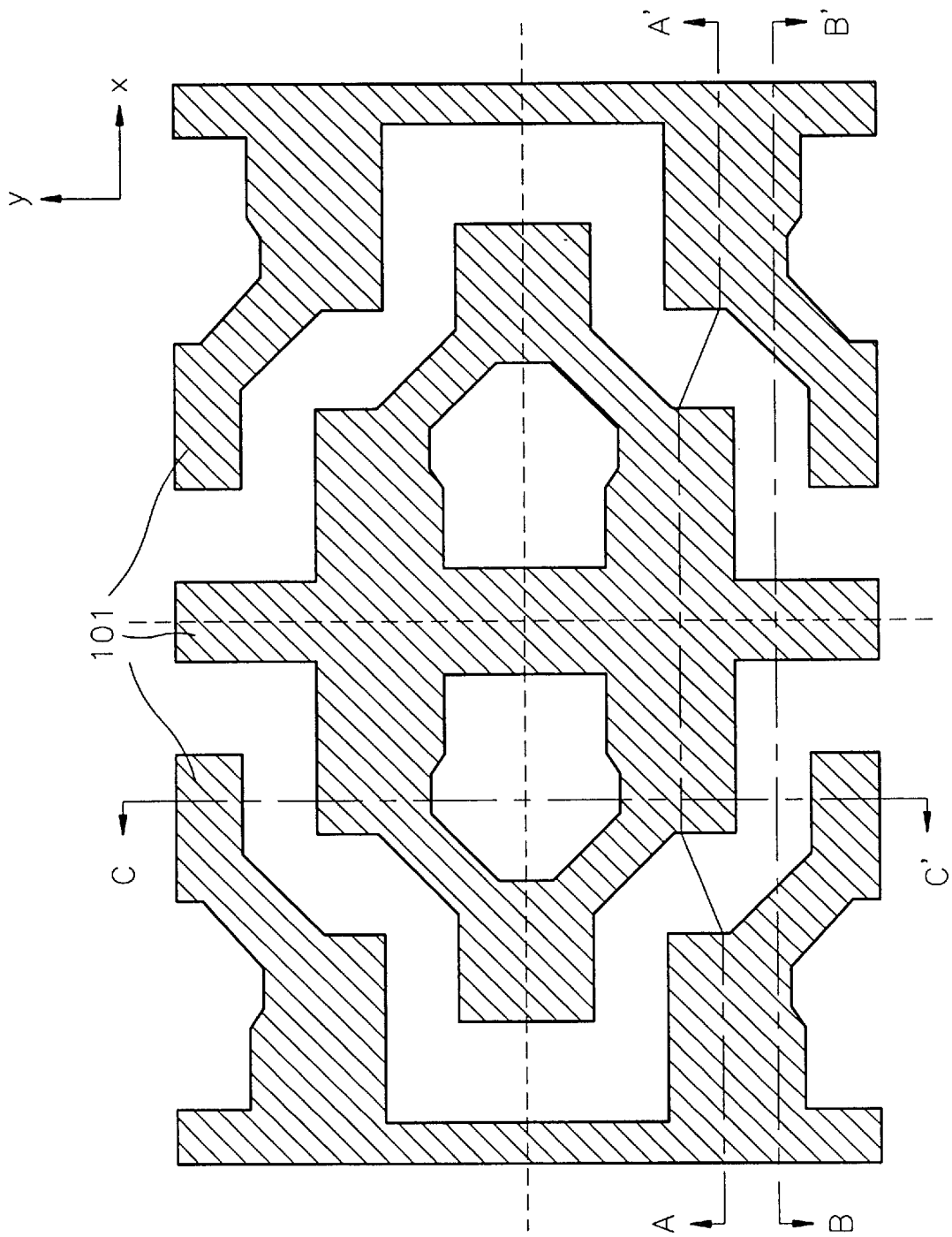
FIGS. 3 through 12 are layout diagrams for illustrating an SRAM cell according to one or more aspects of the present invention.
Figure 4:
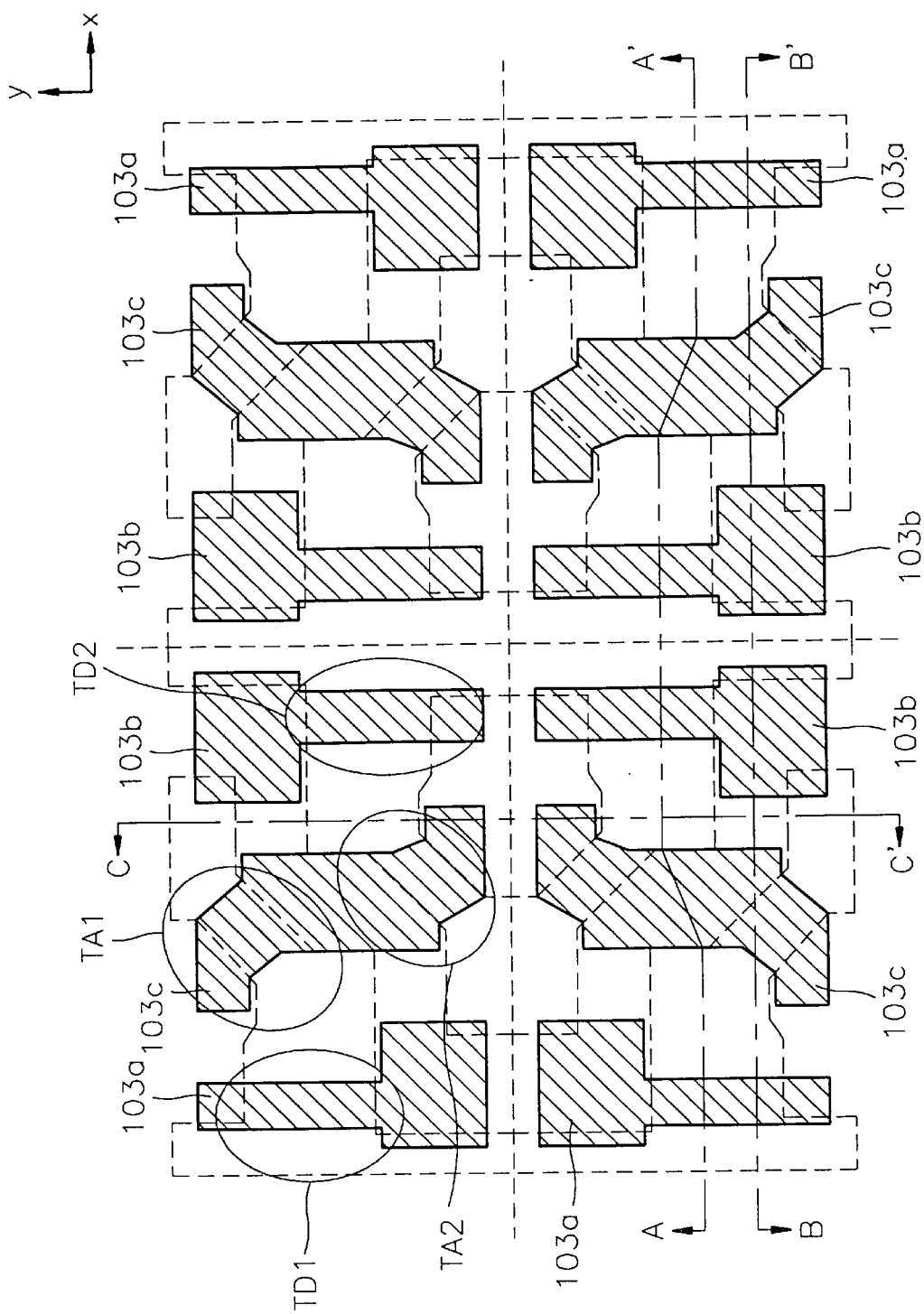
Figure 13A:
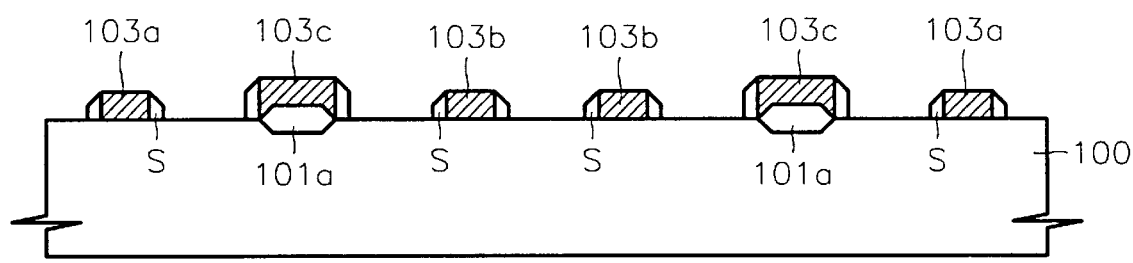
Figure 13B:
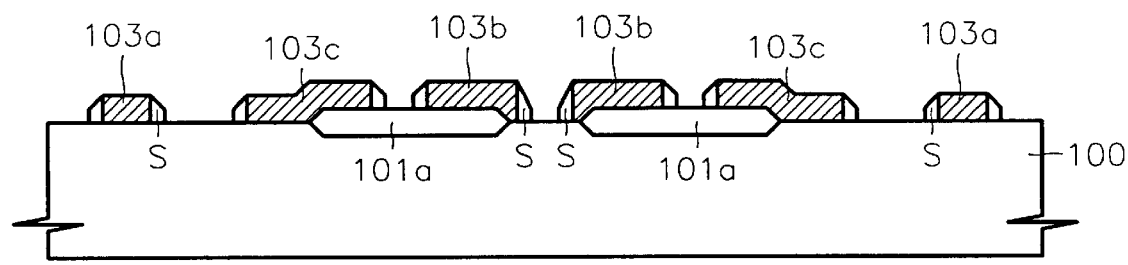
Figure 13C:
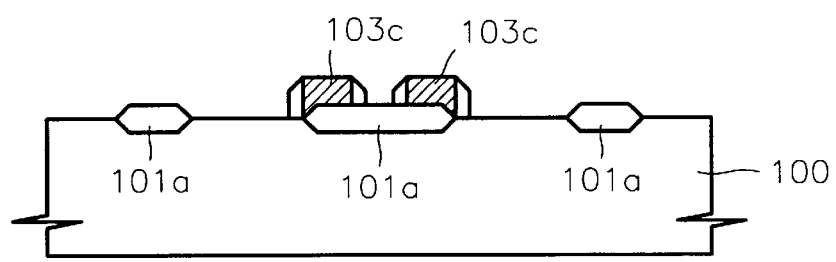
Figure 14A:
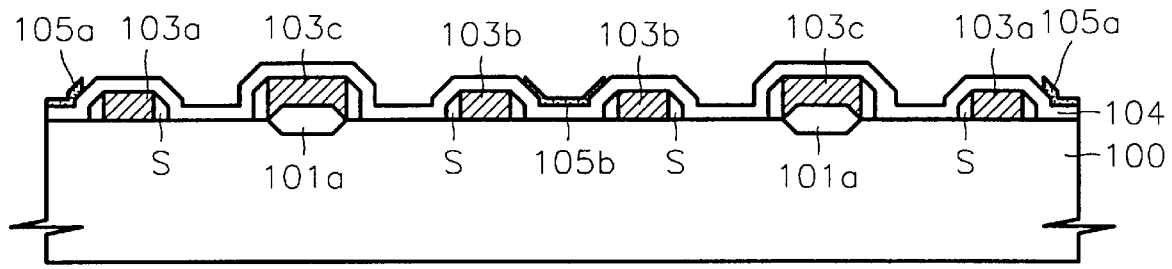
Figure 14B:
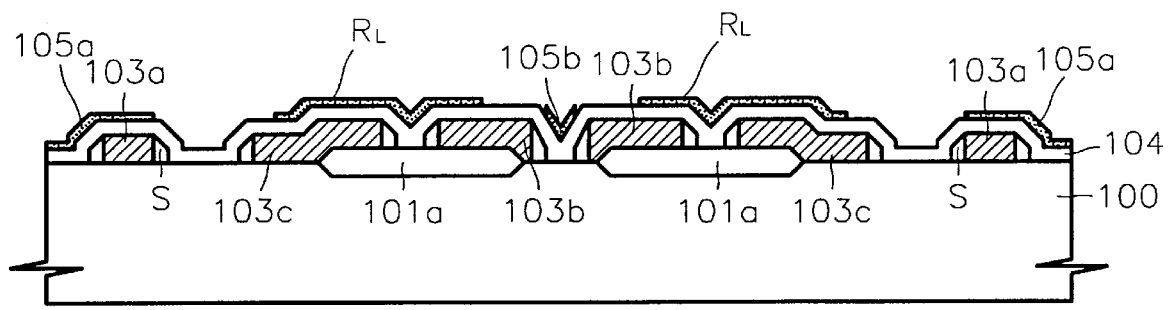
Figure 14C:
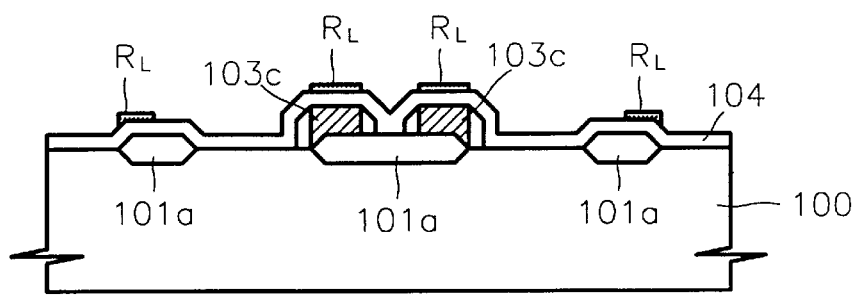
Figure 15A:
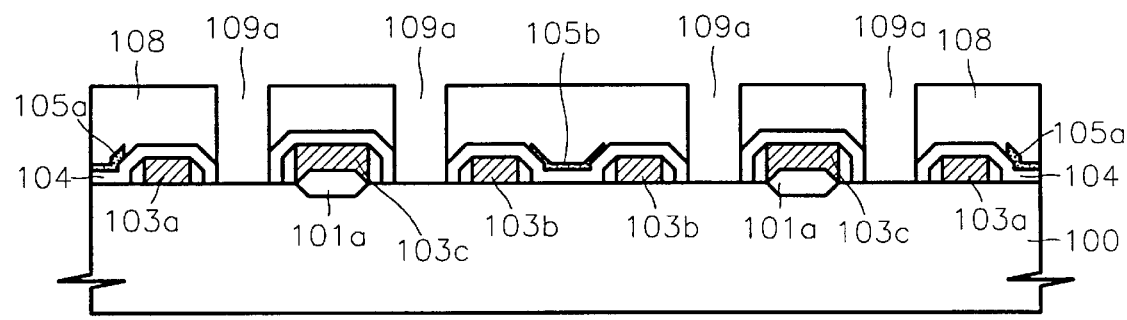
Figure 15B:
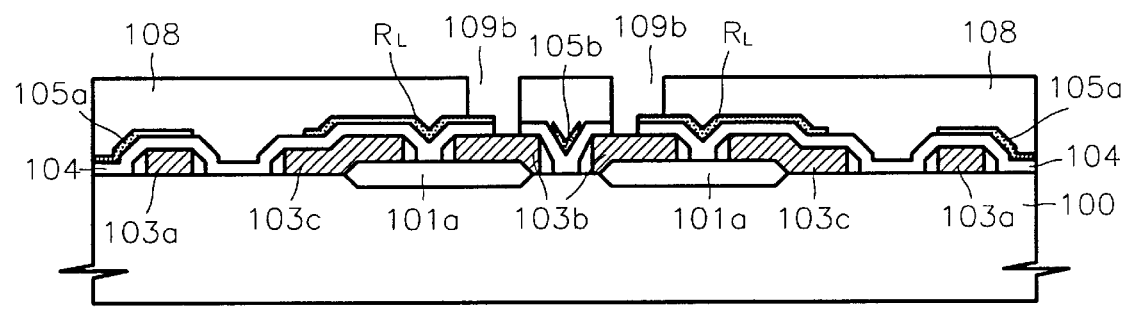
Figure 15C:
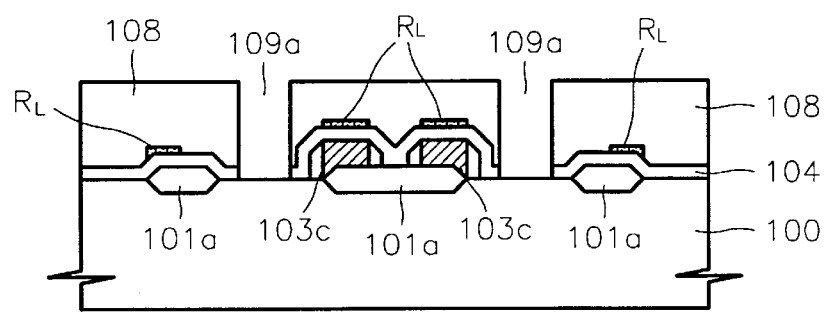
Figure 16A:
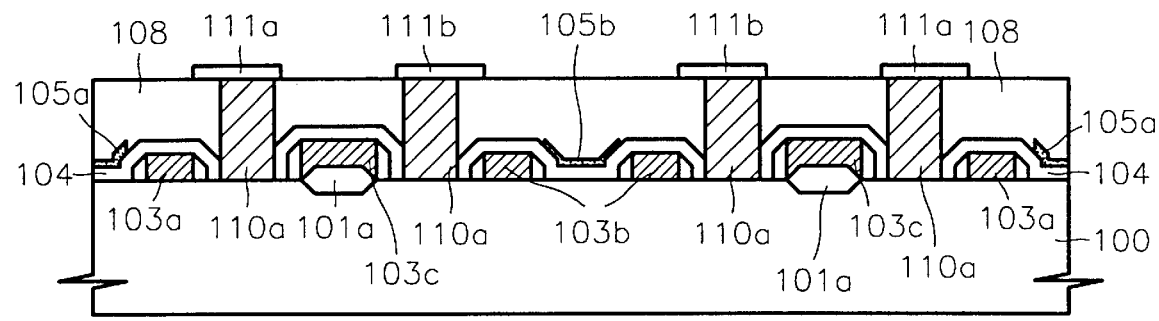
Figure 16B:
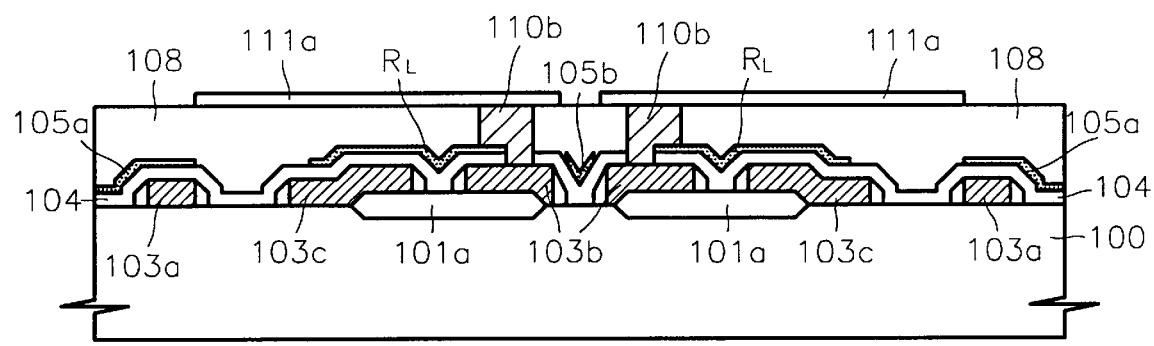
Figure 16C:
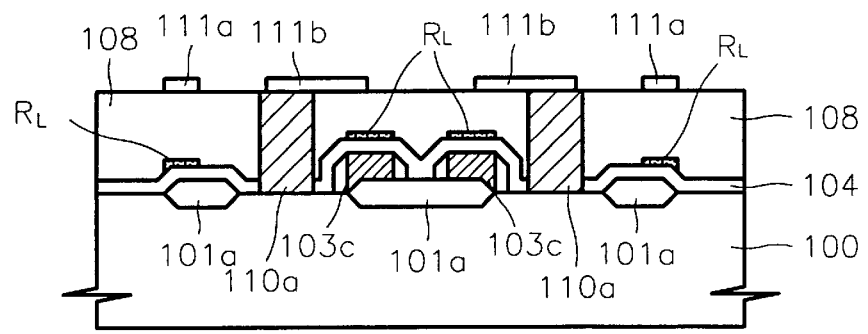
Figure 17A:
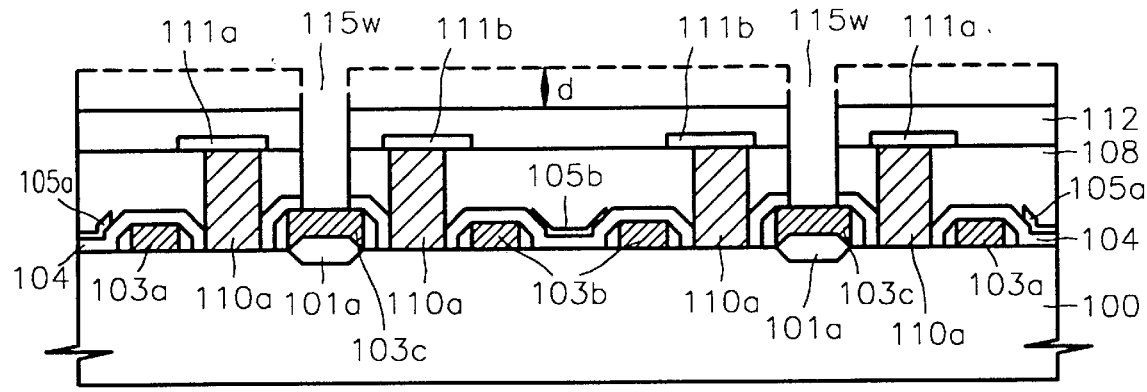
Figure 17B:
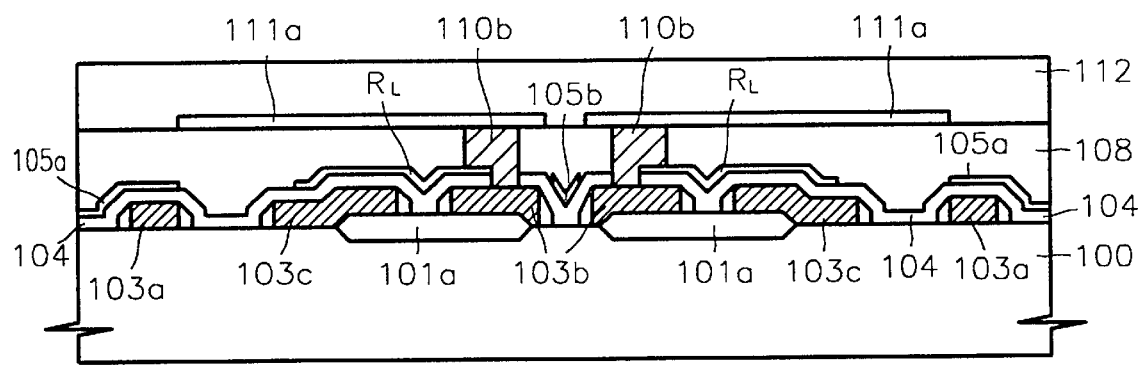
Figure 17C:
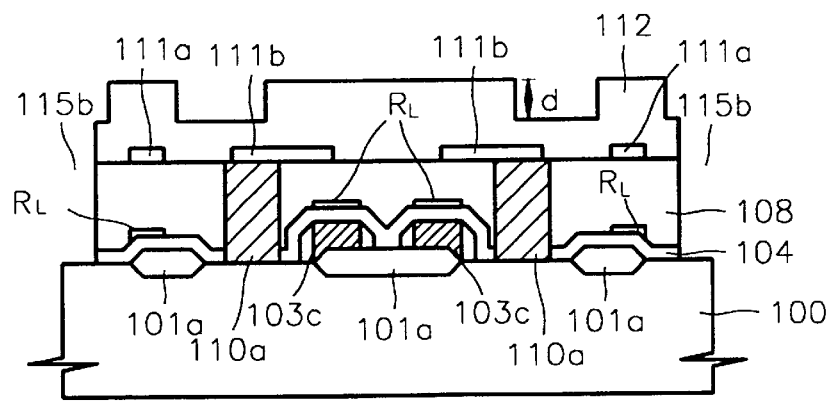

Referring to FIGS. 3, 4, 13A, 13B and 13C, an isolation layer 101a defining an active area is formed on a predetermined area of a semiconductor substrate 100. The isolation layer 101a is formed using a photomask in which the active area pattern 101 of FIG. 3 is drawn. A gate oxide layer (not shown) is formed on the active area of the semiconductor substrate where the isolation layer 101a is formed. A conductive layer, e.g., a doped polysilicon layer or a polycide layer, is formed on the entire surface of the resultant structure where the gate oxide layer is formed, and the conductive layer is patterned using a photomask where gate electrode patterns 103a, 103b and 103c of FIG. 4 are drawn, to thereby form first through third gate electrodes 103a, 103b and 103c on a predetermined area of the gate oxide layer. Here, the first and second gate electrodes 103a and 103b are parallel with each other. The first gate electrode 103a acts as the gate electrode of the first driver transistor TD1, and the second gate electrode 103b acts as the gate electrode of the second driver transistor TD2. The third gate electrode 103c is formed between the first and the second gate electrodes 103a and 103b as shown in FIGS. 13A and 13B. The third gate electrode 103c acts as a common gate electrode of the first and the second transfer transistors TA1 and TA2. Then, impurity ions are implanted into the active area, using the first through third gate electrodes 103a, 103b and 103c and the isolation layer 101a as an ion implantation mask, in order to form a lightly doped drain (LDD) region. Subsequently, a CVD oxide layer is formed on the entire surface of the semiconductor substrate where the first through third gate electrodes 103a, 103b and 103c are formed, and the CVD oxide layer is anisotropically etched to form spacers S on the sidewalls of the first through third gate electrodes 103a, 103b and 103c. Impurity ions are implanted into the active area of the semiconductor substrate where the spacers S are formed, to form source/drain regions (not shown) of the first and the second driver transistors TD1 and TD2 and the first and the second transfer transistors TA1 and TA2.

Referring to FIGS. 5, 6, 14A, 14B and 14C, a first interdielectric layer 104, e.g., an oxide layer, is formed on the entire surface of the semiconductor substrate where the spacers S and the source/drain areas are formed. An undoped polysilicon layer is formed on the first interdielectric layer 104. The undoped polysilicon layer is patterned, to thereby form a pair of power lines 105a and 105b above the source area of the first and the second driver transistors TD1 and TD2, and a pair of load resistors $R_L$ extending from the power lines. The pair of load resistors $R_L$ extend to the upper portions of the first and the second gate electrodes 103a and 103b, respectively. Impurity ions, e.g., arsenic (As) or phosphorus (P), are selectively implanted into the pair of power lines 105a and 105b using the photomask where the ion implantation pattern 107 of FIG. 6 is drawn, to thereby form power lines 105a and 105b having low resistance. At this time, the impurity ions are selectively implanted into a hatched portion of the ion implantation pattern 107 of FIG. 6. Thus, the impurity ions are implanted into the undoped polysilicon layer extending to the upper portions of the first and the second gate electrodes 103a and 103b.

Referring to FIGS. 7, 15A, 15B and 15C, a planarized second interdielectric layer 108, e.g., a CVD oxide layer, is formed on the entire surface of the semiconductor substrate where the load resistors $R_L$ and the power lines 105a and 105b are formed. The second interdielectric layer 108 is patterned to form a pair of node contact holes 109a exposing the first and second node junctions, i.e., the source areas of the first and second transfer transistors TA1 and TA2 and the drain areas of the first and the second driver transistors TD1 and TD2. At this time, a pair of butted contact holes 109b are concurrently formed, exposing one end of each of the first and the second gate electrodes 103a and 103b and one end of a load resistor $R_L$ adjacent to the first and the second gate electrodes.

Referring to FIGS. 8, 16A, 16B and 16C, a conductive layer filling the node contact holes 109a and the butted contact holes 109b, e.g., a doped polysilicon layer, is formed on the entire surface of the semiconductor substrate where the pair of node contact holes 109a and the pair of butted contact holes 109b are formed. Subsequently, the conductive layer is blanket-etched until the second interdielectric layer 108 is exposed, to form first and second plug patterns 110a and 110b in the node contact holes 109a and the butted contact holes 109b, respectively. Here, the first and the second plug patterns 110a and 110b may be formed of a metal layer such as tungsten. A conductive layer, e.g., a doped polysilicon layer or a tungsten polycide layer, is formed on the entire surface of the semiconductor substrate where the first and the second plug patterns 110a and 110b are formed. The conductive layer is patterned to form a first local interconnection line 111a connecting the drain area of the first driver transistor TD1 to the gate electrode 103b of the second driver transistor TD2, and a second local interconnection line 111b connecting the drain area of the second driver transistor TD2 to the gate electrode 103a of the first driver transistor TD1. Thus, the first and second local interconnection lines 111a and 111b constitute a latch circuit.

Referring to FIGS. 9, 10, 17A, 17B and 17C, a third interdielectric layer 112, e.g., a CVD oxide layer, is formed on the entire surface of a semiconductor substrate where the first and the second local interconnection lines 111a and 111b are formed. The third interdielectric layer 112 is etched to a predetermined depth d to form a groove for defining an area where a word line, a bit line pad and a ground line pad are located during a subsequent process. That is, the groove for forming the word line, the bit line pad and the ground line pad is formed using a damascene process. Here, the groove for the word line is parallel with the x-axis, passing through the centers of the cells, and passes the upper portion of the third gate electrode 103c. Also, the groove for the ground line pad is formed on the upper portion of the source area of the driver transistor, and the groove for the bit line pad is formed on the upper portions of drain areas of each of the transfer transistors, which confront the node junction. Subsequently, the third interdielectric layer 112 where the groove for the damascene process is formed is patterned, to form a bit line pad contact hole 115b, a ground line pad contact hole 115s, and a word line contact hole 115w in the groove for the bit line pad, the groove for the ground line pad, and the groove for the word line, respectively. Here, the bit line pad contact hole 115b exposes the drain areas of the transfer transistors, and the ground line pad contact hole 115s exposes source areas of the driver transistors. Also, the word line contact hole 115w exposes the third gate electrode 103c.

Referring to FIGS. 11, 12, 18A, 18B and 18C, a metal layer, e.g., a tungsten layer, is formed on the entire surface of the semiconductor substrate where the bit line pad contact hole 115b, the ground line pad contact hole 115s, and the word line contact hole 115w are formed, filling the contact holes 115b, 115s and 115w and the groove. Subsequently, the metal layer is blanket-etched until the third interdielectric layer 112 is exposed, to form a ground line pad 113s, a bit line pad 113b, and a word line 113w. Preferably, the metal layer is blanket-etched through chemical mechanical polishing (CMP). The ground line pad 113s is connected to the source area of the driver transistor through the ground line pad contact hole 115s, the bit line pad 113b is connected to the drain area of the transfer transistor through the bit line pad contact hole 115b, and the word line 113w is connected to the third gate electrode 103c through the word line contact hole 115w. Then, a fourth interdielectric layer 116, e.g., a CVD oxide layer, is formed on the entire surface of the semiconductor substrate where the bit line pad 113b, the ground line pad 113s and the word line 113w are formed. The fourth interdielectric layer 116 is patterned to form a ground line contact hole 117s exposing the ground line pad 113s and a bit line contact hole 117b exposing the bit line pad 113b. Subsequently, a ground line 119s covering the ground line contact hole 117s, and a bit line 119b covering the bit line contact hole 117b, are formed. The ground line 119s and the bit line 119b are perpendicular to the word line 113w. The ground line 119s is stacked above the power lines 105a and 105b to maximize parasitic capacitance therebetween. If the parasitic capacitance between the ground line 119s and the power lines 105a and 105b is increased, then the power lines 105a and 105b can have higher noise immunity.

Figure 18A:
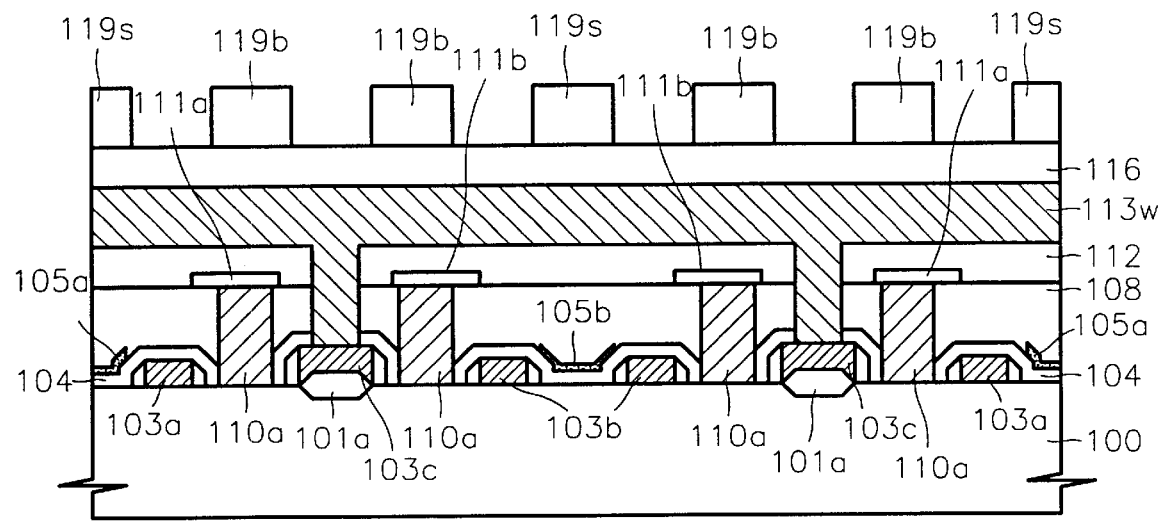
Figure 18B:
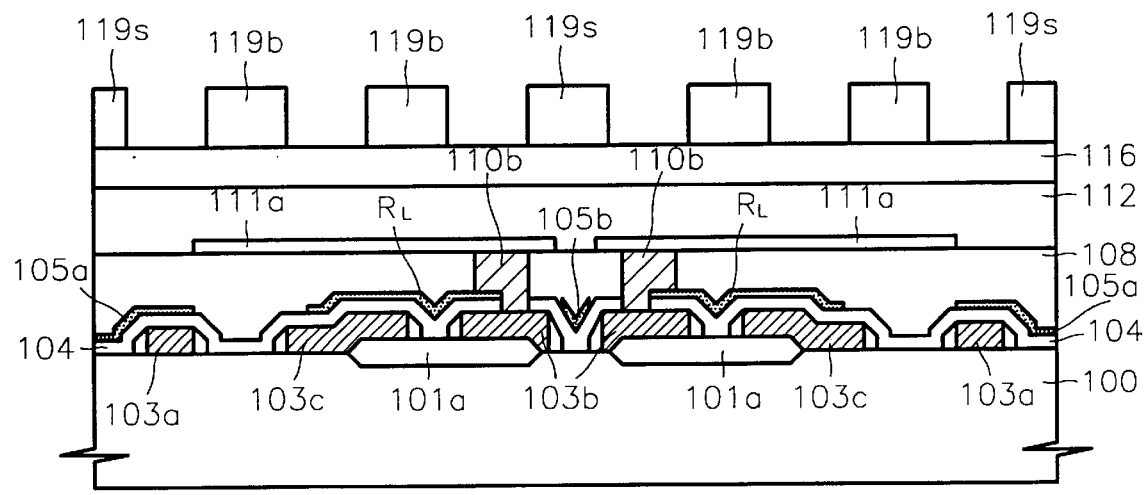
Figure 18C:
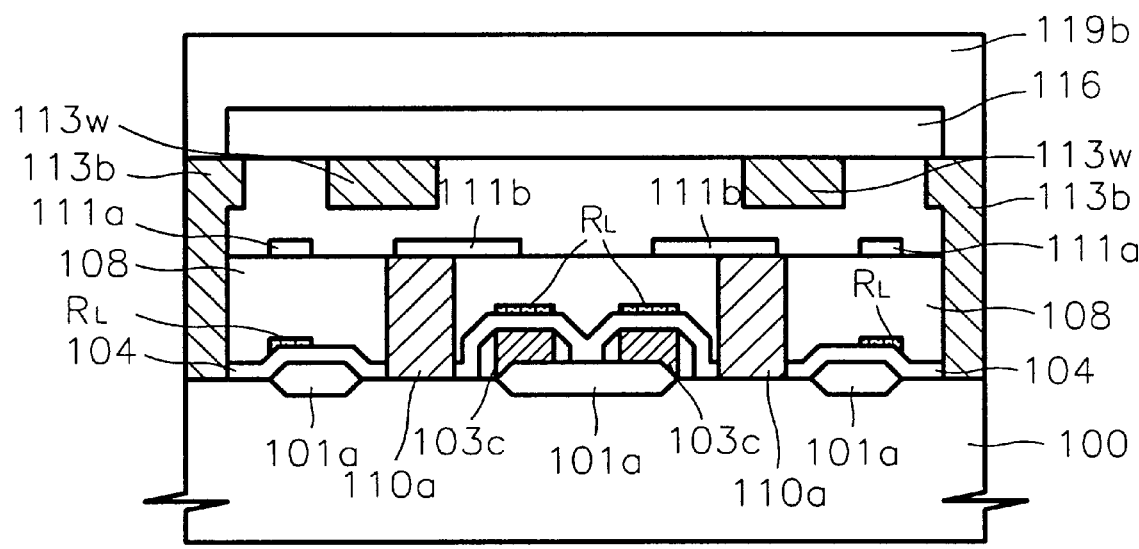
Figure 19:
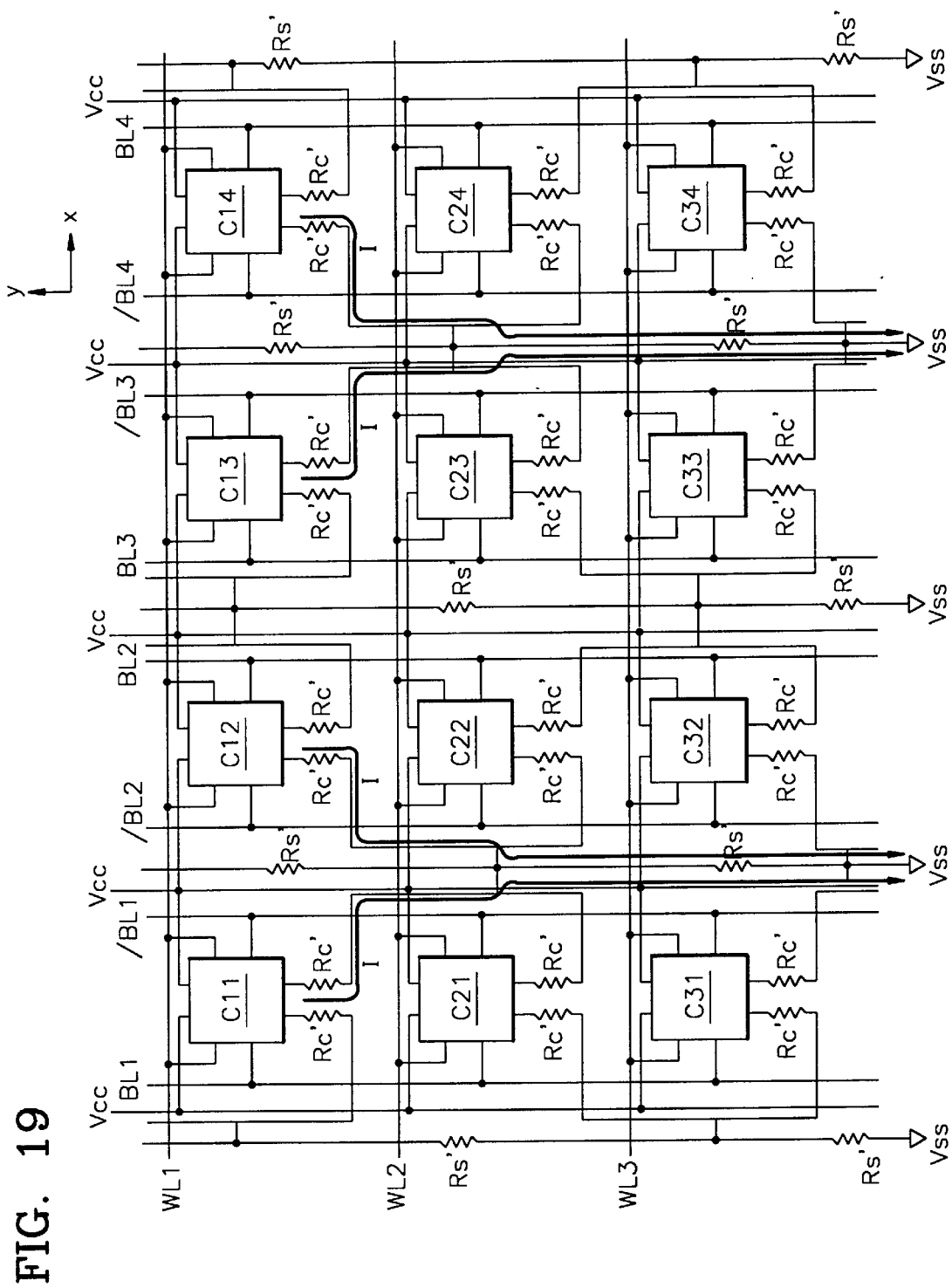
FIG. 19 is an equivalent circuit diagram of part of a cell array area in which the SRAM cell of FIG. 12 is arranged in a matrix.

Referring to FIG. 19, first through third word lines WL1, WL2 and WL3 are parallel with the x-axis, and a plurality of power lines $V_{cc}$ and a plurality of bit lines BL1, /BL1, /BL2, BL2, BL3, /BL3, /BL4 and BL4 are parallel with the y-axis. A plurality of ground lines $V_{ss}$ are parallel with the y-axis, and ground lines $V_{ss}$ and power lines Vcc are stacked as shown in FIGS. 18A and 18B. A plurality of cells C11, C12, C13, C14, ... arranged in the x-direction are connected to the first word line WL1, and a plurality of cells C21, C22, C23, C24, ... arranged in the x-direction are connected to the second word line WL2. A plurality of cells C31, C32, C33, C34, ... are connected to the third word line WL3. If a voltage corresponding to a power supply voltage is applied to the first word line WL1 to select a cell, for example, C12, cell current flows through all cells C11, C12, C13, C14, ... connected to the first word line WL1. At this time, a ground voltage, i.e., 0V, is applied to word lines other than the first word line WL1, so that transfer transistors of cells connected to word lines other than the first word line WL1 are turned off. Thus, the cell current flows through only the plurality of cells C11, C12, C13, C14, ... connected to the first word line WL1. The cell current flows from each bit line to ground lines $V_{ss}$ through one of two driver transistors constituting each of the cells connected to the first word line WL1.

As shown in FIG. 19, the maximum cell current flowing through a ground line $V_{ss}$ is equal to the sum of currents flowing from two adjacent cells. Thus, the cell current flowing through a ground line Vss is two times the current I flowing through a driver transistor. Since the voltage drop due to one ground line $V_{ss}$ is caused by cell current flowing through only two cells, it is less than that of the conventional SRAM cell. This is because the ground line is arranged in parallel with the word line in the conventional SRAM cell, but perpendicular to the word line in the present invention. The voltage drop of the ground line $V_{ss}$ is caused by resistance Rs' of the ground line Vss and contact resistance Rc' between the ground line $V_{ss}$ and the source area of the driver transistor.

Thus, in an SRAM cell as described herein, the bit line is shorter than the word line intersecting the bit line. Thus, the RC time delay caused by the bit line is less than in the conventional SRAM cell in which the bit line is longer than the word line. As a result, the operational speed of the SRAM device can be improved. Also, the ground lines are perpendicular to the word lines. Thus, if a voltage corresponding to a power supply voltage is applied to the word line connected to a selected cell, the cell current flowing through the ground line connected to the selected cell is equal to only the sum of currents flowing through the selected cell and a cell adjacent thereto. As a result, the cell current flowing through one ground line is much less than in the convention SRAM cell, thus minimizing the voltage drop in the ground line. Thus, the range of the operational voltage of the SRAM cell according to the present invention can be maximized, to thereby improve the low voltage characteristics of the cell. Also, a power supply line and a ground line are sequentially stacked parallel with each other, increasing parasitic capacitance of the power supply line. Thus, even if electrical noise is input to the power supply line, the parasitic capacitance of the power supply line can filter the electrical noise. As a result, a stable power supply voltage is supplied to the SRAM cell.

The embodiment described above can be modified and changed within the scope of present invention by a person skilled in the art.

What is claimed is:

1. An SRAM cell comprising:
    a semiconductor substrate;
    first and second driver transistors, having first and second gate electrodes arranged parallel to each other, formed on a top surface of the semiconductor substrate;
    first and second transfer transistors sharing a third gate electrode arranged between the first gate electrode and the second gate electrode, wherein the first and second transfer transistors are connected in series with the first and second driver transistors, respectively; and
    a word line electrically connected to the third gate electrode and crossing over the first and the second gate electrodes.

2. The SRAM cell of claim 1, wherein a length of the SRAM cell in a direction perpendicular to the word line is less than a length of the SRAM cell in a direction parallel to the word line.

3. The SRAM cell of claim 1, wherein a line along a direction corresponding to a channel length of the first and the second transfer transistors forms an angle of between 20–70° with respect to a line along a direction corresponding to a channel length of the first and the second driver transistors.

4. The SRAM cell of claim 1, wherein the word line passes over a channel area of the first driver transistor and a channel area of the second driver transistor.

5. The SRAM cell of claim 1, wherein the word line is passing over and between the first transfer transistor and the second transfer transistor.

6. The SRAM cell of claim 1, further comprising a pair of bit lines arranged parallel to the first and the second gate electrodes, wherein the pair of bit lines are electrically connected to a drain area of the first transfer transistor confronting a first node junction shared by the first transfer transistor and the first driver transistor, and a drain area of the second transfer transistor confronting a second node junction shared by the second transfer transistor and the second driver transistor, respectively.

7. The SRAM cell of claim 6, wherein each bit line is shorter than the word line.

8. The SRAM cell of claim 6, further comprising a pair of ground lines electrically connected to respective source areas of the first and the second driver transistors, wherein the pair of ground lines are arranged parallel to the pair of bit lines.

9. The SRAM cell of claim 8, wherein the pair of bit lines are arranged between the pair of ground lines.

10. The SRAM cell of claim 8, further comprising a pair of power lines connected respectively to the first and the second node junctions through first and second load devices, wherein the pair of power lines are arranged below and parallel to the ground lines.

11. The SRAM cell of claim 10, wherein the first and the second load devices are resistors or thin film transistors.

12. The SRAM cell of claim 10, wherein the first and the second load devices pass over channel areas of the first and the second transfer transistors, respectively.

13. The SRAM cell of claim 6, further comprising a pair of power lines connected respectively to the first and the second node junctions through first and second load devices.

14. The SRAM cell of claim 13, wherein the pair of power lines is arranged parallel to the pair of bit lines.

15. The SRAM cell of claim 13, wherein the first and second load devices are resistors or thin film transistors.

16. The SRAM cell of claim 13, wherein the first and the second load devices respectively pass over channel areas of the first and second transfer transistors.

17. An SRAM cell comprising:
    a semiconductor substrate;
    first and second driver transistors, having first and second gate electrodes arranged parallel to each other on a top surface of the semiconductor substrate;
    first and second transfer transistors sharing a third gate electrode arranged between the first gate electrode and the second gate electrode, wherein the first and second transfer transistors are connected in series with the first and the second driver transistors, respectively;
    a pair of power lines passing over a source area of the first driver transistor and a source area of the second driver transistor, respectively, wherein the pair of power lines are arranged parallel to the first and second gate electrodes;
    a pair of load devices each connected to one end of each of the power lines, wherein the pair of load devices are passing over channel areas of the first and the second transfer transistors to extend to upper portions of the first and second gate electrodes, respectively;
    a first local interconnection line connecting together a first node junction shared by the first driver transistor and the first transfer transistor, the second gate electrode, and one end of the one of the load devices extending to an upper portion of the second gate electrode;
    a second local interconnection line connecting together a second node junction shared by the second driver transistor and the second transfer transistor, the first gate electrode, and one end of the other of the load devices extending to an upper portion of the first gate electrode; and a word line arranged perpendicular to the first and the second gate electrodes and passing between the first transfer transistor and the second transfer transistor, wherein the word line is electrically connected to the third gate electrode.

18. The SRAM cell of claim 17, wherein the pair of load devices are resistors or thin film transistors.

19. The SRAM cell of claim 17, wherein the word line passes over channel areas of the first and the second driver transistors.

20. The SRAM cell of claim 17, wherein a length of the SRAM cell in a direction parallel to the word line is greater than a length of the SRAM cell in a direction perpendicular to the word line.

21. The SRAM cell of claim 17, wherein first interdielectric layers are interposed respectively between the first and the second gate electrodes and the pair of power lines, and between the third gate electrode and the pair of load devices.

22. The SRAM cell of claim 21, wherein second and third interdielectric layers are sequentially stacked and are interposed between the word line and the pair of power lines.

23. The SRAM cell of claim 17, further comprising a pair of ground lines electrically connected to source areas of the first and the second driver transistors, respectively, wherein each of the ground lines is stacked on and parallel to each of the power lines.

24. The SRAM cell of claim 23, further comprising a pair of bit lines parallel to the pair of ground lines, wherein the pair of bit lines are arranged between the pair of ground lines and are electrically connected to drain areas of the first and the second transfer transistors, respectively.

25. The SRAM cell of claim 24, wherein the pair of bit lines and the pair of ground lines are formed from the same conductive layer.

26. The SRAM cell of claim 25, wherein the pair of bit lines and the pair of ground lines are isolated from the word line by an interdielectric layer.

* * * * *